United States Patent
Pagaila et al.

(10) Patent No.: US 8,097,489 B2
(45) Date of Patent: Jan. 17, 2012

(54) SEMICONDUCTOR DEVICE AND METHOD OF MOUNTING PRE-FABRICATED SHIELDING FRAME OVER SEMICONDUCTOR DIE

(75) Inventors: Reza A. Pagaila, Singapore (SG); Byung Tai Do, Singapore (SG); Dioscoro A. Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 369 days.

(21) Appl. No.: 12/409,142

(22) Filed: Mar. 23, 2009

(65) Prior Publication Data

US 2010/0237477 A1    Sep. 23, 2010

(51) Int. Cl.
*H01L 21/44* (2006.01)
*H01L 21/48* (2006.01)

(52) U.S. Cl. ......... 438/106; 438/107; 438/124; 438/127

(58) Field of Classification Search .......... 438/106–108, 438/112, 124, 126, 127; 257/E21.499, E21.502, 257/E21.503, E21.508
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,432,253 B1 * | 8/2002 | Chung | 156/295 |
| 7,268,426 B2 * | 9/2007 | Warner et al. | 257/707 |
| 7,619,901 B2 | 11/2009 | Eichelberger et al. | |
| 7,700,411 B2 * | 4/2010 | Yang et al. | 438/109 |
| 2006/0255458 A1 | 11/2006 | Dangelmaier | |
| 2006/0278972 A1 | 12/2006 | Bauer et al. | |
| 2008/0105966 A1 | 5/2008 | Beer et al. | |

\* cited by examiner

*Primary Examiner* — Hung Vu
(74) *Attorney, Agent, or Firm* — Robert D. Atkins; Patent Law Group: Atkins & Associates, P.C.

(57) ABSTRACT

A semiconductor device includes a pre-fabricated shielding frame mounted over a sacrificial substrate and semiconductor die. An encapsulant is deposited through an opening in the shielding frame around the semiconductor die. A first portion of the shielding frame to expose the encapsulant. Removing the first portion also leaves a second portion of the shielding frame over the semiconductor die as shielding from interference. A third portion of the shielding frame around the semiconductor die provides a conductive pillar. A first interconnect structure is formed over a first side of the encapsulant, shielding frame, and semiconductor die. The sacrificial substrate is removed. A second interconnect structure over the semiconductor die and a second side of the encapsulant. The shielding frame can be connected to low-impedance ground point through the interconnect structures or TSV in the semiconductor die to isolate the die from EMI and RFI, and other inter-device interference.

20 Claims, 6 Drawing Sheets

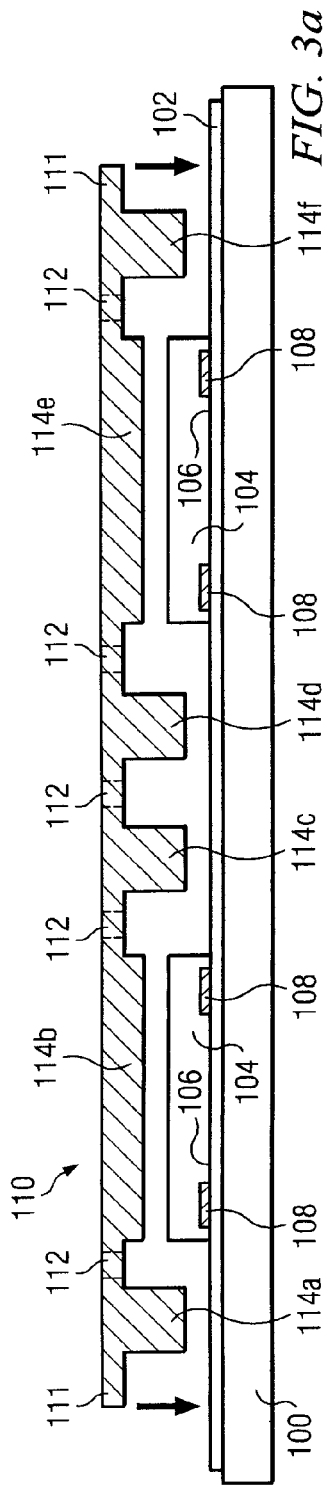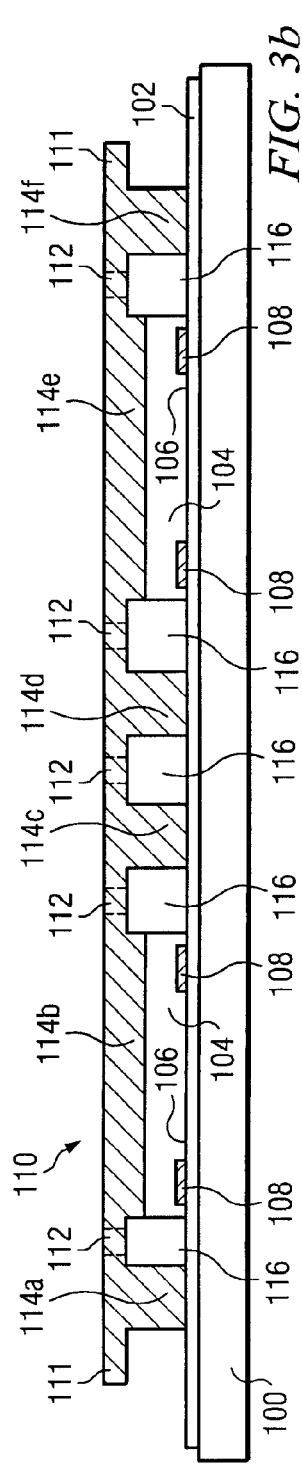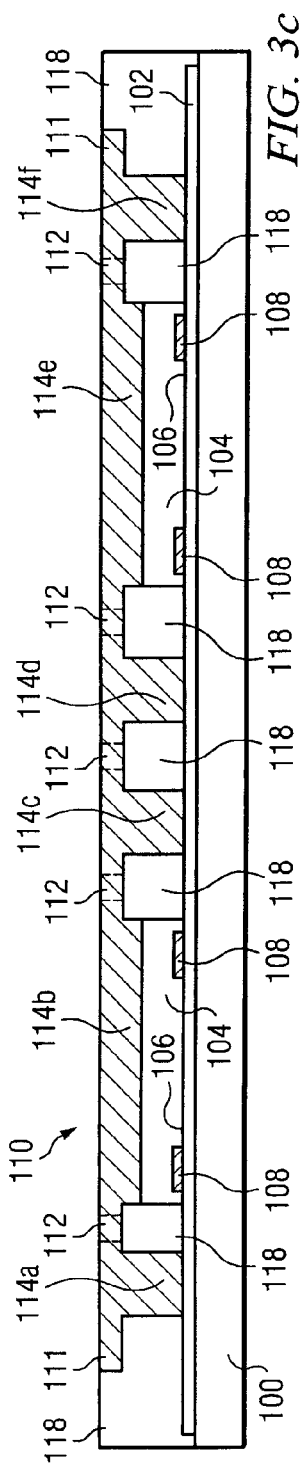

US 8,097,489 B2

SEMICONDUCTOR DEVICE AND METHOD OF MOUNTING PRE-FABRICATED SHIELDING FRAME OVER SEMICONDUCTOR DIE

FIELD OF THE INVENTION

The present invention relates in general to semiconductor devices and, more particularly, to a semiconductor device and method of mounting a pre-fabricated shielding frame over a semiconductor die for isolation from electromagnetic interference (EMI) and radio frequency interference (RFI), or other inter-device interference.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired EMI, RFI, and other inter-device interference, such as capacitive, inductive, or conductive coupling, also known as cross-talk, which can interfere with the operation of adjacent circuit elements.

The vertical electrical interconnection between stacked semiconductor packages and external devices can be accomplished with conductive through silicon vias (TSV) or through hole vias (THV). The THVs are formed in a peripheral region around the device by drilling through encapsulant and filling the holes with conductor. Vertical conductive pillars can also be formed in the peripheral region prior to encapsulation. Both vertical interconnection techniques consume manufacturing time and expense.

SUMMARY OF THE INVENTION

A need exists to provide vertical electrical interconnection and further to isolate semiconductor die from EMI, RFI, and other inter-device interference. Accordingly, in one embodiment, the present invention is a method of making a semiconductor device comprising the steps of providing a pre-fabricated shielding frame, providing a sacrificial substrate, mounting a semiconductor die to the sacrificial substrate, mounting the shielding frame over the semiconductor die and sacrificial substrate, depositing an encapsulant through the shielding frame around the semiconductor die, and removing a first portion of the shielding frame to expose the encapsulant. Removing the first portion of the shielding frame leaves a second portion of the shielding frame over the semiconductor die as shielding from interference. The method further includes the steps of forming a first interconnect structure over the semiconductor die, second portion of the shielding frame, and a first side of the encapsulant, removing the sacrificial substrate, and forming a second interconnect structure over the semiconductor die and a second side of the encapsulant opposite the first side of the encapsulant.

In another embodiment, the present invention is a method of making a semiconductor device comprising the steps of providing a pre-fabricated shielding frame, providing a sacrificial substrate, mounting a semiconductor die to the sacrificial substrate, mounting the shielding frame over the semiconductor die and sacrificial substrate, depositing an encapsulant through the shielding frame around the semiconductor die, and removing a first portion of the shielding frame to expose the encapsulant. Removing the first portion of the shielding frame leaves a second portion of the shielding frame over the semiconductor die as shielding from interference. The method further includes the step of forming a first interconnect structure over the semiconductor die, second portion of the shielding frame, and a first side of the encapsulant.

In another embodiment, the present invention is a method of making a semiconductor device comprising the steps of providing a pre-fabricated shielding frame, mounting the shielding frame over a semiconductor die, depositing an encapsulant through the shielding frame around the semiconductor die, and removing a first portion of the shielding frame to expose the encapsulant while leaving a second portion of the shielding frame over the semiconductor die.

In another embodiment, the present invention is a semiconductor device comprising a semiconductor die and pre-fabricated shielding frame mounted over the semiconductor die. An encapsulant is deposited around the semiconductor die. A first interconnect structure is formed over a first side of the encapsulant, shielding frame, and semiconductor die.

BRIEF DESCRIPTION OF THE DRAWINGS

FIGS. 3a-3g illustrate a process of forming a pre-fabricated shielding frame over a semiconductor die;

DETAILED DESCRIPTION OF THE DRAWINGS

Figure 1:
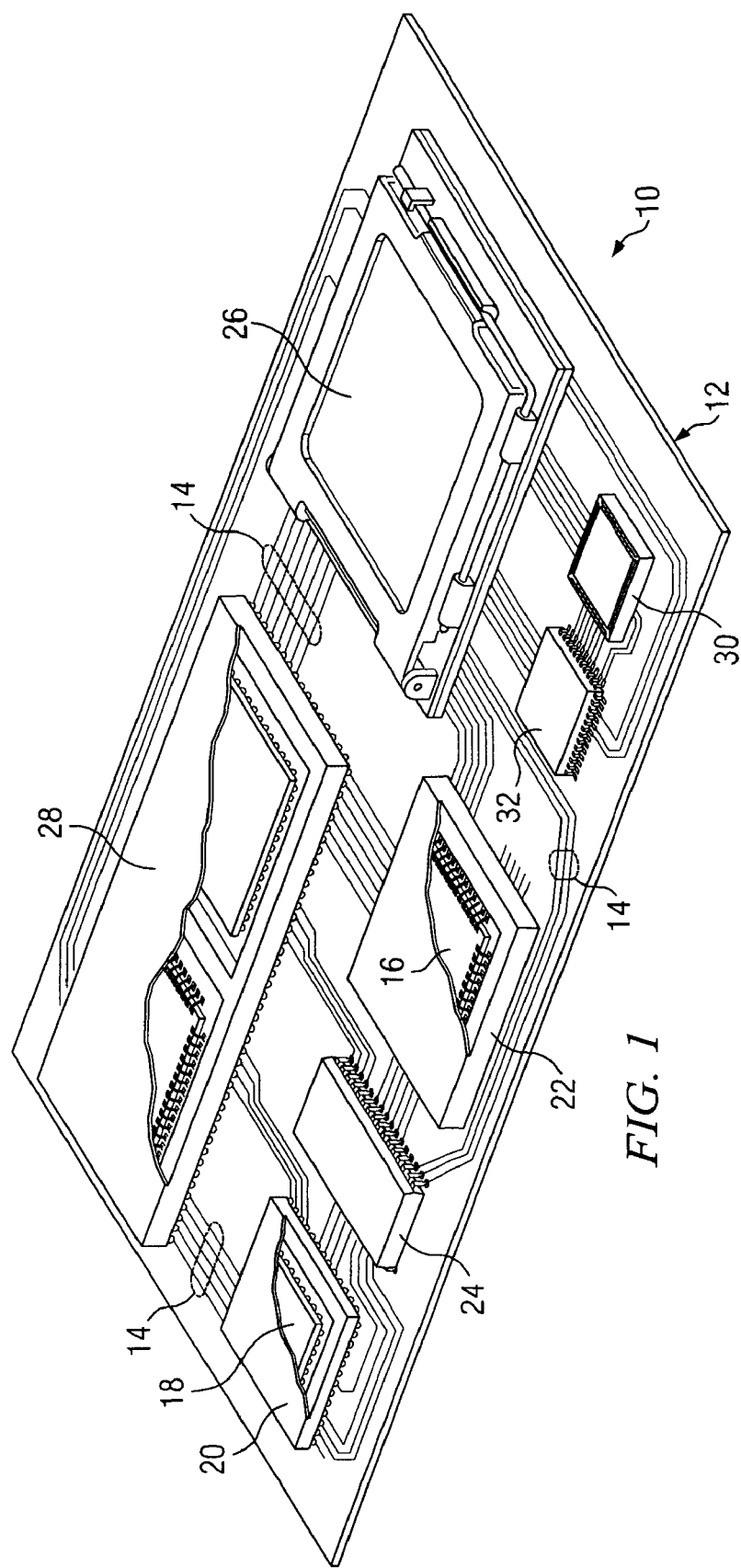
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface.

Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
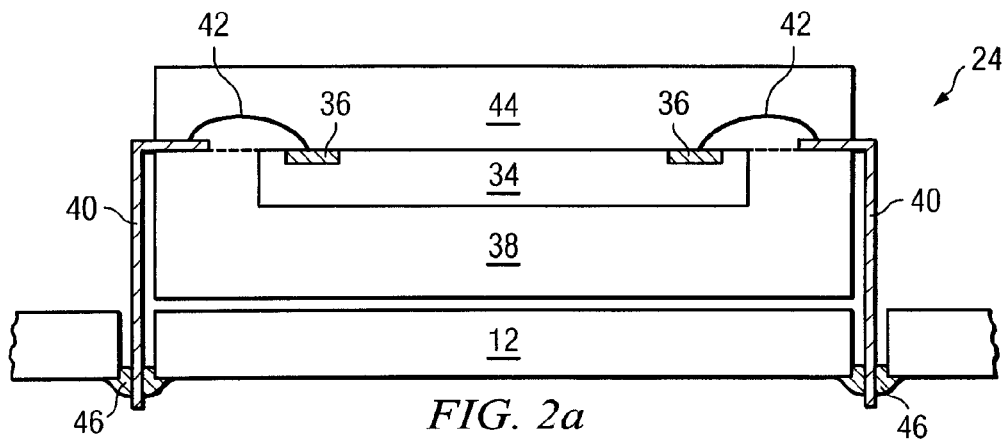
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
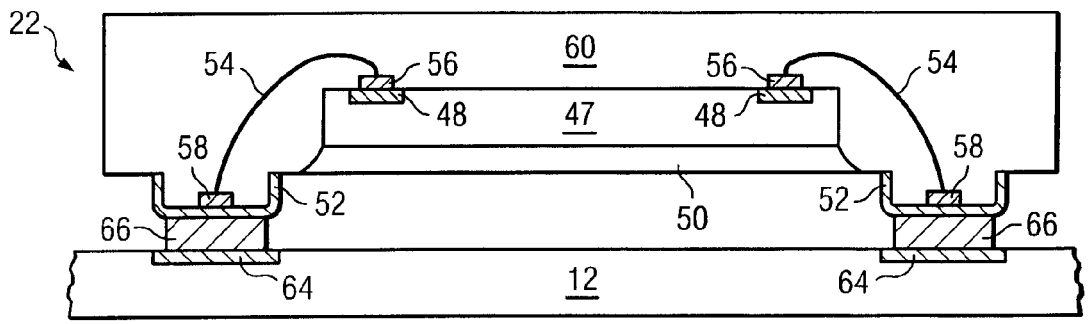

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
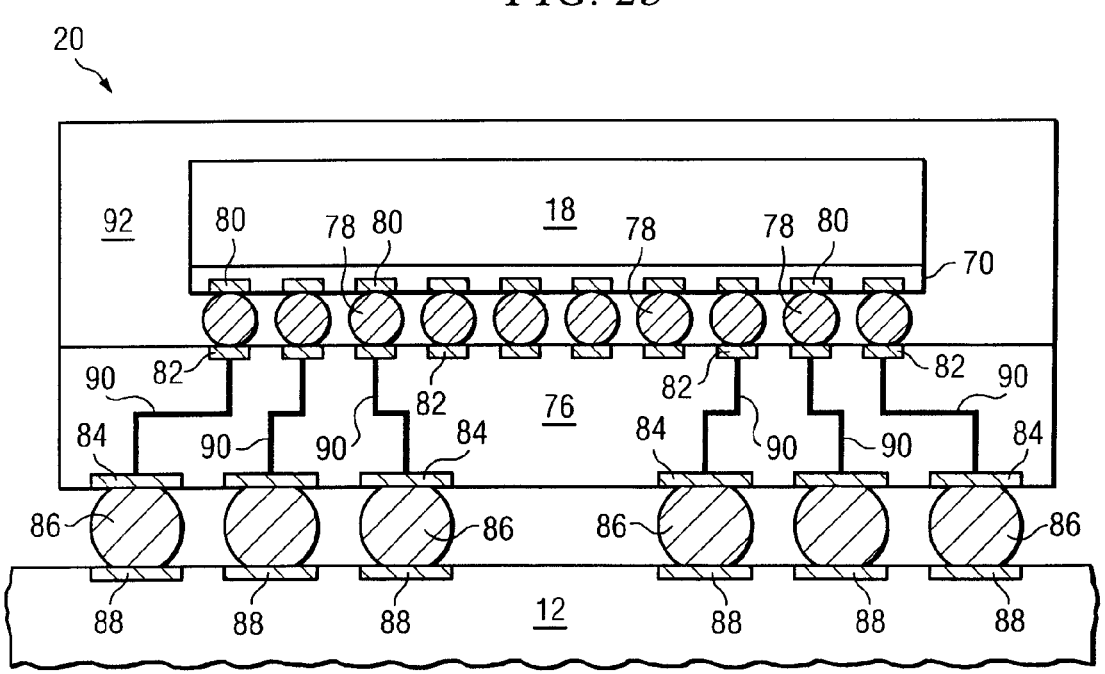

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3D:
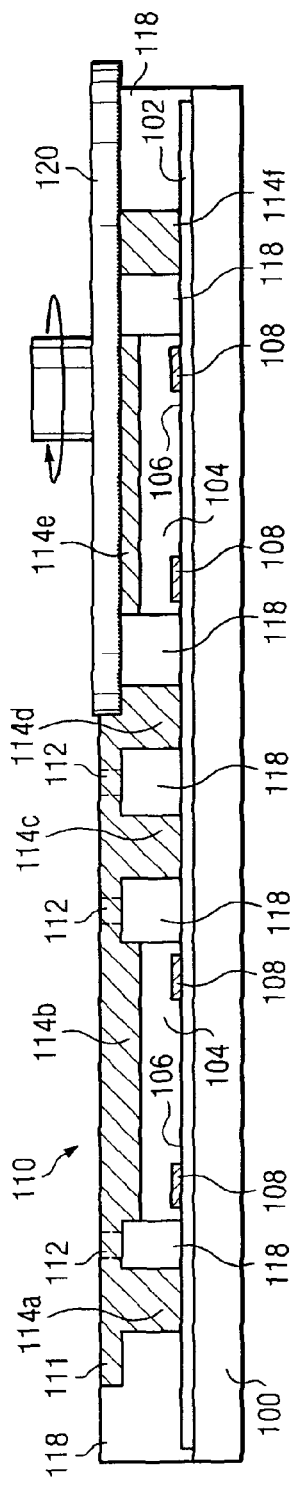

FIGS. 3a-3g illustrate a process of forming a semiconductor package with a pre-fabricated shielding layer placed over semiconductor die in a fan-out wafer level chip scale package (FO-WLCSP). In FIG. 3a, a sacrificial substrate or carrier 100 contains dummy or sacrificial base material such as silicon, polymer, polymer composite, metal, ceramic, glass, glass epoxy, beryllium oxide, or other suitable low-cost, rigid material or bulk semiconductor material for structural support.

An interface layer 102 is applied to carrier 100 with heat or light releasable temporary bonding film. The interface layer 102 can be one or more layers of silicon dioxide (SiO2), silicon nitride (Si3N4), silicon oxynitride (SiON), organic film, or metal film with wet etching selectivity. The interface layer 102 is deposited using lamination, PVD, CVD, printing, spin coating, spray coating, sintering, or thermal oxidation. The interface layer 102 can be a temporary bonding film or etch-stop layer.

Semiconductor die 104 are mounted to interface layer 102. Each semiconductor die 104 includes analog or digital circuits implemented as active and passive devices, conductive layers, and dielectric layers formed over topside active surface 106 and electrically interconnected according to the electrical design of the die. For example, the circuit may include one or more transistors, diodes, and other circuit elements formed within active surface 106 to implement baseband digital circuits, such as digital signal processor (DSP), memory, or other signal processing circuit. Semiconductor die 102 may also contain integrated passive devices (IPD), such as inductors, capacitors, and resistors, for radio frequency (RF) signal processing. Contact pads 108 electrically connect to active and passive devices and signal traces within active surface 106 of semiconductor die 102.

The IPDs in semiconductor die 104 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

A typical RF system requires multiple IPDs and other high frequency circuits in one or more semiconductor packages to perform the necessary electrical functions. The high frequency electrical devices generate or are susceptible to undesired electromagnetic interference (EMI), radio frequency interference (RFI), or other inter-device interference, such as capacitive, inductive, or conductive coupling, also known as cross-talk, which can interfere with the operation of adjacent or nearby circuit elements.

To reduce inter-device interference, a pre-fabricated shielding frame 110 is mounted over semiconductor die 104 and interface layer 102, as shown in FIGS. 3a-3b. Shielding frame 110 includes a flat plate 111 with a plurality of bodies 114a-114f integrated with plate 111 and separated by cavities 116. Bodies 114a, 114c, 114d, and 114f are sufficiently thick to extend down to interface layer 102. Bodies 114a, 114c, 114d, and 114f will become conductive pillars, as described below. Bodies 114b and 114e are thinner than bodies 114a, 114c, 114d, and 114f to accommodate semiconductor die 104. A plurality of openings 112 is formed through plate 111 into cavities 116. Shielding frame 110 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other interference. Shielding frame 110 can also be a non-metal material such as carbon-black or aluminum flake to reduce the effects of EMI and RFI. The bodies 114b and 114e of shielding frame 110 contact a back surface of semiconductor die 104 opposite active surface 106. An optional adhesive or thermal interface material can be applied to the back surface of semiconductor die 104 prior to mounting shielding frame 110.

FIG. 3c shows an encapsulant or molding compound 118 deposited over semiconductor die 104 and interface layer 102 using a paste printing, compressive molding, transfer molding, liquid encapsulant molding, vacuum lamination, or other suitable applicator. The encapsulation process disperses encapsulant 118 through openings 112 into cavities 116 below shielding frame 110. Encapsulant 118 can be polymer composite material, such as epoxy resin with filler, epoxy acrylate with filler, or polymer with proper filler. Encapsulant 118 is non-conductive and environmentally protects the semiconductor device from external elements and contaminants.

In FIG. 3d, grinder 120 removes a portion of shielding frame 110, including plate 111, down to openings 112 to expose encapsulant 118 in cavities 116. The bodies 114b and 114e of shielding frame 110 remain over the back surface of semiconductor die 104 to provide the desired EMI and RFI isolation for the die. The remaining portion of shielding frame 110 between semiconductor die 104 becomes conductive pillars or posts 114a, 114c, 114d, and 114f for vertical z-direction interconnection.

Figure 3E:
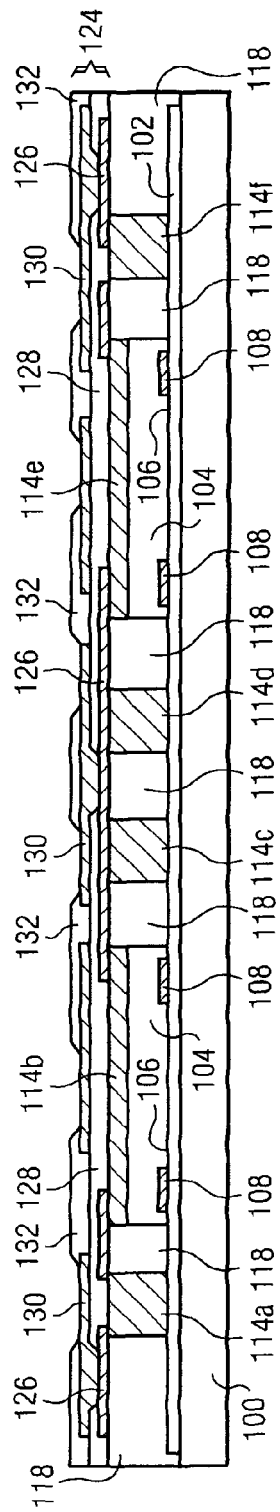

In FIG. 3e, a topside build-up interconnect structure 124 is formed over encapsulant 118, bodies 114b and 114e of shielding frame 110, and conductive pillars 114a, 114c, 114d, and 114f. The build-up interconnect structure 124 includes an electrically conductive layer 126 formed over shielding frame 110 and conductive pillars 114a, 114c, 114d, and 114f in sections or portions using a patterning and deposition process. Conductive layer 126 is formed using PVD, CVD, electrolytic plating, electroless plating process, or other suitable metal deposition process. Conductive layer 126 can be one or more layers of Al, Cu, Sn, Ni, Au, Ag, or other suitable electrically conductive material. One portion of conductive layer 126 electrically connects to conductive pillars 114a, 114c, 114d, and 114f. Other portions of conductive layer 126 can be electrically common or electrically isolated depending on the design and function of the semiconductor die.

An insulating or passivation layer 128 is formed over encapsulant 118, bodies 114b and 114e of shielding layer 110, and conductive layer 126. The insulating layer 128 can be one or more layers of SiO2, Si3N4, SiON, tantalum pentoxide (Ta2O5), aluminum oxide (Al2O3), or other material having similar insulating and structural properties. The insulating layer 128 is deposited using PVD, CVD, printing, spin coating, spray coating, sintering or thermal oxidation. A portion of insulating layer 128 is removed by an etching process to expose conductive layer 126.

An electrically conductive layer 130 formed over insulating layer 128 and conductive layer 126 in sections or portions using a patterning and deposition process. Conductive layer 130 can be one or more layers of Al, Cu, Sn, Ni, Au, Ag, or other suitable electrically conductive material. One portion of conductive layer 130 electrically connects to conductive layer 126. Other portions of conductive layer 130 can be electrically common or electrically isolated depending on the design and function of the semiconductor device.

An insulating or passivation layer 132 is formed over insulating layer 128 and conductive layer 130. The insulating layer 132 can be one or more layers of SiO2, Si3N4, SiON, Ta2O5, Al2O3, or other material having similar insulating and structural properties. The insulating layer 132 is deposited using PVD, CVD, printing, spin coating, spray coating, sintering or thermal oxidation. A portion of insulating layer 132 is removed by an etching process to expose conductive layer 130.

Figure 3F:
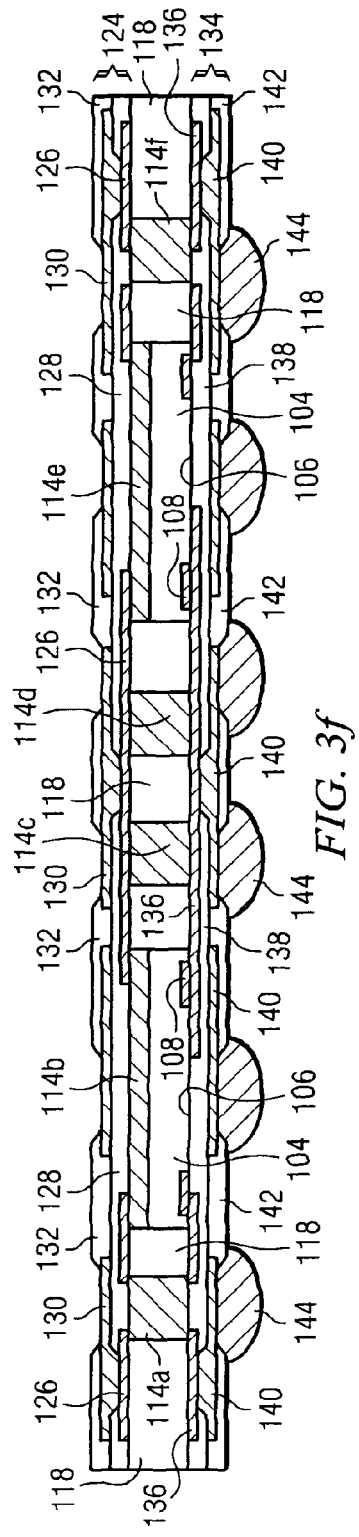

In FIG. 3f, substrate 100 and interface layer 102 are removed by chemical etching, mechanical peel-off, CMP, mechanical grinding, thermal bake, laser scanning, or wet stripping. A bottom-side build-up interconnect structure 134 is formed over encapsulant 118, semiconductor die 104, and conductive pillars 114a, 114c, 114d, and 114f. The build-up interconnect structure 134 includes an electrically conductive layer 136 formed over encapsulant 118 and conductive pillars 114a, 114c, 114d, and 114f in sections or portions using a patterning and deposition process. Conductive layer 136 is formed using PVD, CVD, electrolytic plating, electroless plating process, or other suitable metal deposition process. Conductive layer 136 can be one or more layers of Al, Cu, Sn, Ni, Au, Ag, or other suitable electrically conductive material. One portion of conductive layer 136 electrically connects to conductive pillars 114a, 114c, 114d, and 114f. Other portions of conductive layer 136 can be electrically common or electrically isolated depending on the design and function of the semiconductor die.

An insulating or passivation layer 138 is formed over encapsulant 118, semiconductor die 104, and conductive layer 136. The insulating layer 138 can be one or more layers of SiO2, Si3N4, SiON, Ta2O5, Al2O3, or other material having similar insulating and structural properties. The insulating layer 138 is deposited using PVD, CVD, printing, spin coating, spray coating, sintering or thermal oxidation. A portion of insulating layer 138 is removed by an etching process to expose conductive layer 136.

An electrically conductive layer 140 formed over insulating layer 138 and conductive layer 136 in sections or portions using a patterning and deposition process. Conductive layer 140 can be one or more layers of Al, Cu, Sn, Ni, Au, Ag, or other suitable electrically conductive material. One portion of conductive layer 140 electrically connects to conductive layer 136. Other portions of conductive layer 140 can be electrically common or electrically isolated depending on the design and function of the semiconductor device.

An insulating or passivation layer 142 is formed over insulating layer 138 and conductive layer 140. The insulating layer 142 can be one or more layers of SiO2, Si3N4, SiON, Ta2O5, Al2O3, or other material having similar insulating and structural properties. The insulating layer 142 is deposited using PVD, CVD, printing, spin coating, spray coating, sintering or thermal oxidation. A portion of insulating layer 142 is removed by an etching process to expose conductive layer 140.

An electrically conductive solder material is deposited over conductive layer 140 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 144. In some applications, solder bumps 144 are reflowed a second time to improve electrical contact to conductive layer 142.

Figure 3G:
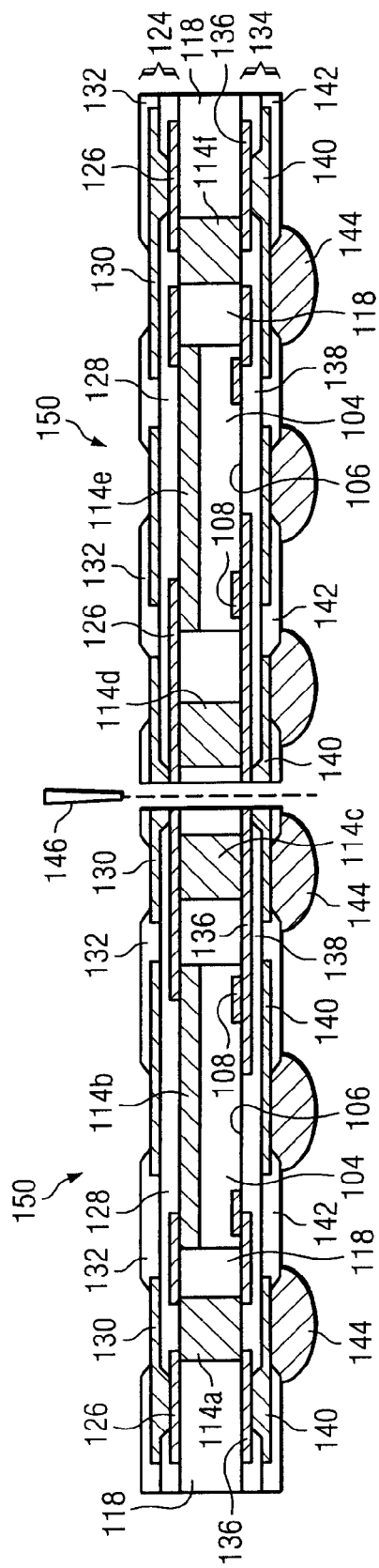
Figure 4:
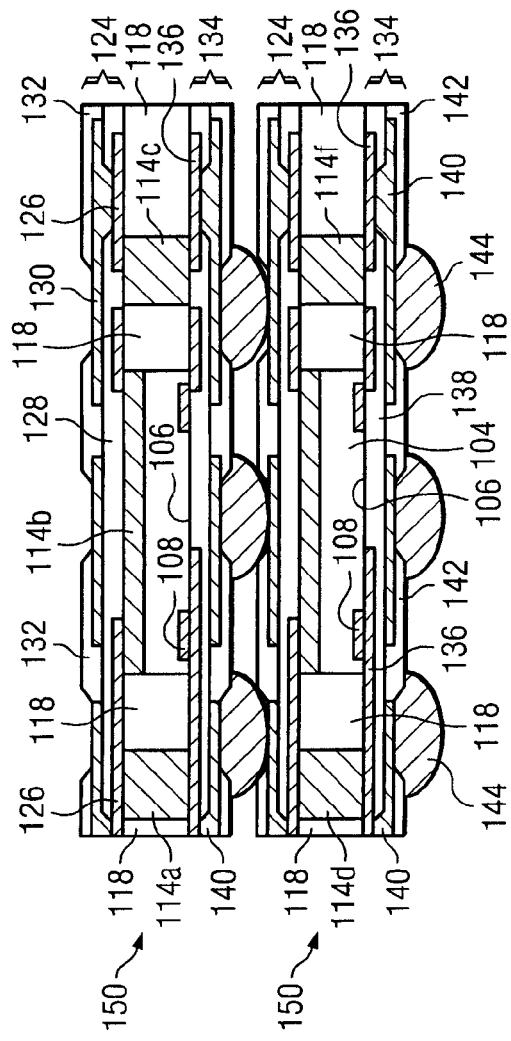
FIG. 4 illustrates stacked FO-WLCSP with pre-fabricated shielding frame mounted over the semiconductor die and interconnected with conductive pillars.

Semiconductor die 104 are singulated with saw blade or laser cutting device 146 into individual semiconductor devices 150, as shown in FIG. 3g. After singulation, the individual semiconductor devices 150 can be stacked, as shown in FIG. 4. Conductive pillars 114a, 114c, 114d, and 114f provide z-interconnect between topside interconnect build-up layer 124 and bottom-side interconnect build-up layer 134. Conductive layer 126 and 132 electrically connect through conductive pillars 114a and 114c to conductive layers 136 and 140 and contact pads 108 of semiconductor die 104. The bodies 114b and 114e of shielding frame 110 provide isolation for semiconductor die 104 from EMI, RFI, and other inter-device interference. The bodies 114b and 114e of shielding frame 110 can be connected to a low-impedance ground point through interconnect structure 124 or 134 or conductive pillars 114a, 114c, 114d, and 114f. The bodies 114b and 114e of shielding frame 110 eliminate the need for separate EMI shielding, as found in the prior art, which adds time and cost to the manufacturing process. The bodies 114b and 114e of shielding frame 110 also provide for dissipation of heat generated by semiconductor die 104. The bodies 114a, 114c, 114d, and 114f of shielding frame 110 are conductive pillars connected between interconnect structures 124 and 134.

Figure 5:
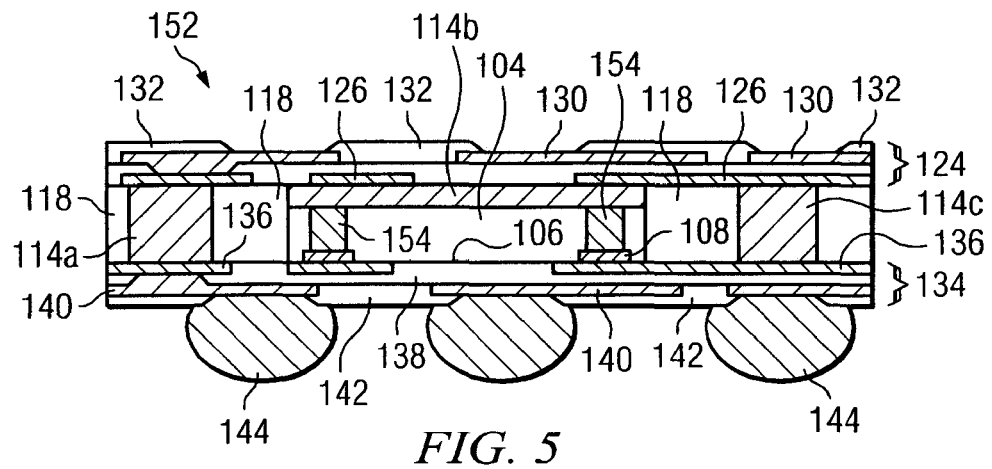
FIG. 5 illustrates the FO-WLCSP having semiconductor die with TSV to ground the shielding frame.

FIG. 5 shows another embodiment of the semiconductor device. In this case, semiconductor device 152 includes through silicon vias (TSV) 154 formed in semiconductor die 104h. TSVs 154 are formed by etching or drilling a via through the silicon material of semiconductor die 104 and filling the via with Al, Cu, Sn, Ni, Au, Ag, titanium (Ti), W, or other suitable electrically conductive material. The bodies 114b and 114e of shielding frame 110 are electrically connected through TSVs 154 to contact pads 108 and interconnect structure 134. Accordingly, TSVs 154 provide a conduction path from bodies 114b and 114e of shielding frame 110 through contact pads 108 and interconnect structure 134 to an external low-impedance ground point.

Figure 6:
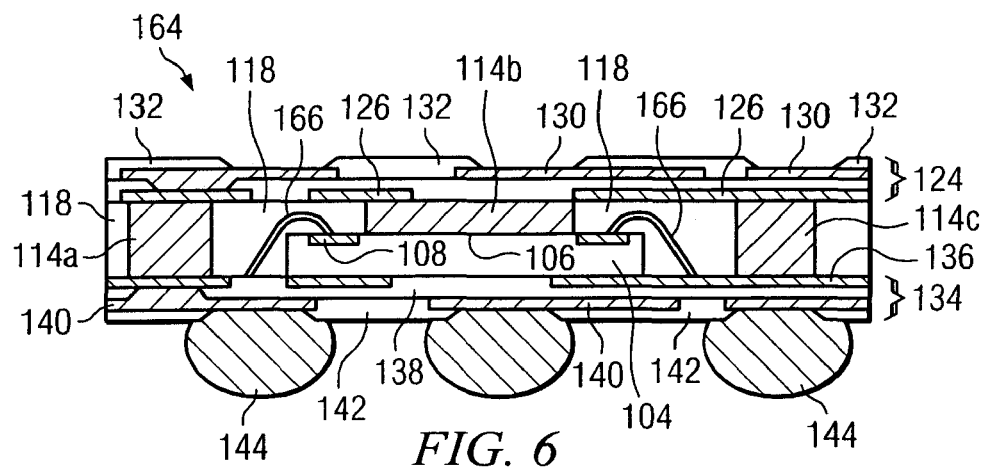
FIG. 6 illustrates the FO-WLCSP with bond wires connected between the semiconductor die contact pads and bottom-side interconnect structure.

FIG. 6 shows semiconductor device 160 with active surface 106 and contact pads 108 of semiconductor die 104 oriented face up. Contact pads 108 are electrically connected to interconnect structure 134 through bond wires 162. Bond wires 162 can be one or more layers of Al, Cu, Sn, Ni, Au, Ag, or other suitable electrically conductive material.

Figure 7:
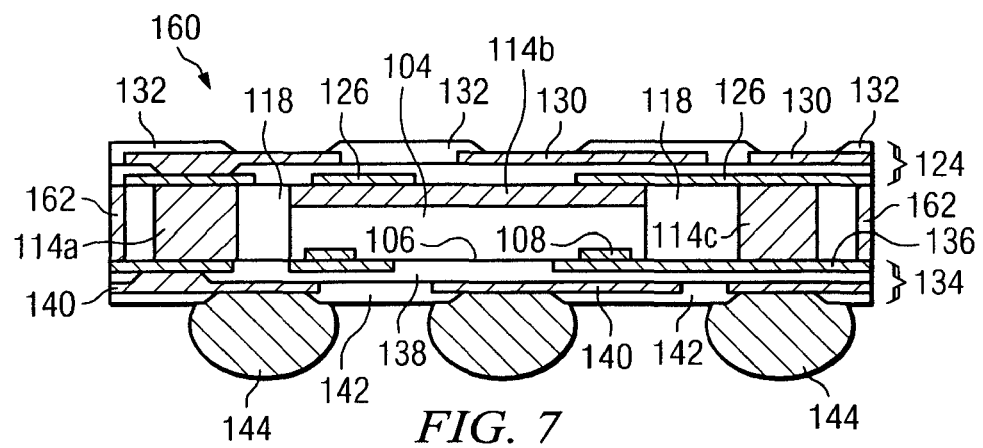
FIG. 7 illustrates the FO-WLCSP with an additional shielding layer formed around the semiconductor die between the topside and bottom-side interconnect structures.

FIG. 7 shows semiconductor device 164 with additional shielding layer 166 formed between interconnect structures 124 and 134. Shielding layer 166 can be Cu, Al, stainless steel, nickel silver, low-carbon steel, silicon-iron steel, foil, epoxy, conductive resin, and other metals and composites capable of blocking EMI, RFI, and other inter-device interference.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a pre-fabricated shielding frame;
   providing a sacrificial substrate;
   mounting a semiconductor die to the sacrificial substrate;
   mounting the shielding frame over the semiconductor die and sacrificial substrate;
   depositing an encapsulant through the shielding frame around the semiconductor die;
   removing a first portion of the shielding frame to expose the encapsulant, wherein removing the first portion of the shielding frame leaves a second portion of the shielding frame over the semiconductor die as shielding from interference;
   forming a first interconnect structure over the semiconductor die, second portion of the shielding frame, and a first side of the encapsulant;
   removing the sacrificial substrate; and
   forming a second interconnect structure over the semiconductor die and a second side of the encapsulant opposite the first side of the encapsulant.

2. The method of claim 1, wherein removing the first portion of the shielding frame leaves a third portion of the shielding frame around the semiconductor die which provides a conductive pillar electrically connected between the first and second interconnect structures.

3. The method of claim 2, further including:
   stacking a plurality of the semiconductor devices; and
   electrically connecting the stacked semiconductor devices through the conductive pillar.

4. The method of claim 1, further including providing an opening through the shielding frame to disperse the encapsulant into cavities below the shielding frame.

5. The method of claim 1, further forming a through silicon via in the semiconductor die to ground the shielding frame.

6. The method of claim 1, further including forming a bond wire between contacts pads of the semiconductor die and the second interconnect structure.

7. The method of claim 1, further including forming a shielding layer around the semiconductor die between the first and second interconnect structures.

8. A method of manufacturing a semiconductor device, comprising:
   providing a pre-fabricated shielding frame;
   providing a sacrificial substrate;
   mounting a semiconductor die to the sacrificial substrate;
   mounting the shielding frame over the semiconductor die and sacrificial substrate;
   depositing an encapsulant through the shielding frame around the semiconductor die;
   removing a first portion of the shielding frame to expose the encapsulant, wherein removing the first portion of the shielding frame leaves a second portion of the shielding frame over the semiconductor die as shielding from interference; and
   forming a first interconnect structure over the semiconductor die, second portion of the shielding frame, and a first side of the encapsulant.

9. The method of claim 8, further including forming a second interconnect structure over the semiconductor die and a second side of the encapsulant opposite the first side of the encapsulant.

10. The method of claim 9, further including forming a shielding layer around the semiconductor die between the first and second interconnect structures.

11. The method of claim 9, wherein removing the first portion of the shielding frame leaves a third portion of the shielding frame around the semiconductor die which provides a conductive pillar connected between the first and second interconnect structures.

12. The method of claim 11, further including:
   stacking a plurality of the semiconductor devices; and
   electrically connecting the stacked semiconductor devices through the conductive pillar.

13. The method of claim 8, further including providing an opening through the shielding frame to disperse the encapsulant into cavities below the shielding frame.

14. The method of claim 8, further forming a through silicon via in the semiconductor die to ground the shielding frame.

15. A method of manufacturing a semiconductor device, comprising:
   providing a pre-fabricated shielding frame;
   mounting the shielding frame over a semiconductor die;
   depositing an encapsulant through the shielding frame around the semiconductor die; and
   removing a first portion of the shielding frame to expose the encapsulant while leaving a second portion of the shielding frame over the semiconductor die.

16. The method of claim 15, further including:
   forming a first interconnect structure over the semiconductor die, second portion of the shielding frame, and a first side of the encapsulant; and
   forming a second interconnect structure over the semiconductor die and a second side of the encapsulant opposite the first side of the encapsulant.

17. The method of claim 15, wherein removing the first portion of the shielding frame leaves a third portion of the shielding frame around the semiconductor die which provides a conductive pillar.

18. The method of claim 17, further including:
   stacking a plurality of the semiconductor devices; and
   electrically connecting the stacked semiconductor devices through the conductive pillar.

19. The method of claim 15, further including providing an opening through the shielding frame to disperse the encapsulant into cavities below the shielding frame.

20. The method of claim 15, further forming a through silicon via in the semiconductor die to ground the shielding frame.

* * * * *